United States Patent [19]

Solomon

[11] Patent Number: 5,010,025
[45] Date of Patent: Apr. 23, 1991

[54] METHOD OF MAKING TRENCH JFET INTEGRATED CIRCUIT ELEMENTS

[75] Inventor: Allen L. Solomon, Fullerton, Calif.

[73] Assignee: Grumman Aerospace Corporation, Bethpage, N.Y.

[21] Appl. No.: 331,952

[22] Filed: Apr. 3, 1989

[51] Int. Cl.$^5$ .......................................... H01L 21/265
[52] U.S. Cl. ........................................ 437/29; 437/38; 437/40; 437/203; 437/228
[58] Field of Search ............... 437/29, 40, 41, 38, 437/203, 228; 357/23.4, 22; 156/643, 644

[56] References Cited

U.S. PATENT DOCUMENTS

| | | | |
|---|---|---|---|
| 3,223,904 | 12/1965 | Warner et al. | 357/22 |
| 3,930,300 | 1/1976 | Nicolay | 357/22 |
| 3,953,879 | 4/1976 | O'Connor-'diArlach | 357/22 |
| 4,049,476 | 9/1977 | Horie | 437/75 |
| 4,375,124 | 5/1983 | Cogam | 357/22 |
| 4,455,740 | 6/1984 | Iwai | 437/203 |
| 4,571,815 | 2/1986 | Baliga | 357/22 |
| 4,633,281 | 12/1986 | Benjamin et al. | 357/22 |
| 4,754,310 | 6/1988 | Coe | 357/23.4 |
| 4,774,556 | 9/1988 | Fujii et al. | 357/22 |

FOREIGN PATENT DOCUMENTS

| | | | |
|---|---|---|---|
| 0128769 | 6/1988 | Japan | 357/22 |
| 0086561 | 3/1989 | Japan | 357/22 |
| 2181890 | 4/1987 | United Kingdom | 357/22 |

OTHER PUBLICATIONS

R. Gegorian and G. C. Temes, Analog MOS Integrated Circuits for Signal Processing, pp. 98, 99, John Wiley & Sons, N.Y., N.Y. (1986).
Uiswamatha, "Electronic Potentiometer", J. Inst. of Electronics and Telecomm. India, vol. 22, Nov. 76, pp. 742-743.
D. C. Mayer et al., "A Submicron-Channel Vertical Junction Field-Effect Transistor", IEDM 1977, pp. 532-525.

Primary Examiner—Brian E. Hearn
Assistant Examiner—Tom Thomas
Attorney, Agent, or Firm—Stetina & Brunda

[57] ABSTRACT

A method and construction are disclosed to form a trench gate JFET transistor. The invention comprises forming a first trench in a semiconductor substrate, forming a gate channel about the trench and forming a conductive layer upon the surface of the gate channel. The conductive layer interfaces with the gate channel to form a p-n junction. Source and drain regions are formed adjacent to a trench and disposed in electrical contact with the gate channel. An integral capacitor may be added to the construction by forming a second trench, which extends through and excavates a portion of the first trench. The drain region is extended about the surface of the second trench to remain in electrical contact with the gate channel. A layer of insulating material is applied to the second trench, which is then filled with a body of conductive material. The conductive material is insulated from the conductive layer by the insulating layer.

14 Claims, 3 Drawing Sheets

METHOD OF MAKING TRENCH JFET INTEGRATED CIRCUIT ELEMENTS

BACKGROUND OF THE INVENTION

The present invention finds application in connection with thin silicon plates or wafers formed to support a multiplicity of monolithically integrated data processor circuits. More particularly, the invention is for the production of junction field effect transistor (JFET) integrated circuit elements formed on silicon wafers and used to interface devices such as infrared detector elements to a processing network that amplifies, stores and interprets detected infrared frequency signals.

The infrared spectrum covers a range of wavelengths longer than the visible wavelengths, but shorter than microwave wavelengths. Visible wavelengths are generally regarded as between 0.4 and 0.75 micrometers. The infrared wavelengths extend from 0.75 micrometers to 1 millimeter. The function of infrared detectors is to respond to the energy of a wavelength within some particular portion of the infrared region.

Heated objects generate radiant energy having characteristic wavelengths within the infrared spectrum. Many current infrared image detection systems incorporate arrays with large numbers of discrete, highly sensitive detector elements, the electrical outputs of which are connected to processing circuitry. By analyzing the pattern and sequence of detector element excitation, the processing circuitry can identify and track sources of infrared radiation. Though the theoretical performance of such contemporary systems is satisfactory for many applications, it is difficult to construct structures that adequately interface large numbers of detector elements with associated circuitry in a practical and reliable manner. Consequently, practical applications for contemporary infrared image detector systems have necessitated further advances in the areas of miniaturization of the detector array and accompanying circuitry, of minimization of circuit generated noise that results in lower sensitivity of the detected signal, and of improvements in the reliability and economical production of detector arrays and the accompanying circuitry.

Contemporary arrays of detectors, useful for some applications, may be sized to include 256 detector elements on a side, or a total of 65,536 detectors, the size of each square detector being approximately 0.009 centimeters on a side, with 0.00116 centimeters spacing between detectors. Such a subarray would therefore be 2.601 centimeters on a side. Interconnection of such a subarray to processing circuitry would require connecting each of the 65,536 detectors to processing circuitry within a square, a little more than one inch on a side. Each subarray may, in turn, be joined to other subarrays to form an array that connects to 25,000,000 detectors or more. As would be expected considerable difficulties are presented in electrically connecting the detector elements to associated circuitry, and laying out the circuitry in a minimal area. The problems of forming processing circuitry in such a dense environment require minimization of the surface area used for the circuitry.

The outputs of the detector elements typically undergo a series of processing steps in order to permit derivation of the informational content of the detector output signal. The more fundamental processing steps, such as preamplification, tuned band pass filtering, clutter and background rejection, multiplexing and fixed noise pattern suppression, are preferably done at a location adjacent the detector array focal plane. As a consequence of such on-focal plane, or up-front signal processing, reductions in size, power and cost of the main processor may be achieved. Moreover, on-focal plane signal processing helps alleviate performance, reliability and economic problems associated with the construction of millions of closely spaced conductors connecting each detector element to the signal processing network.

Aside from the aforementioned physical limitations on the size of the detector module, limitations on the performance of contemporary detection systems can arise due to the presence of electronic circuit generated noise, components can degrade the minimal level of detectivity available from the detector.

A type of noise that is particularly significant where the preamplifier operates at low frequency is commonly called flicker or 1/f noise. Because 1/f noise can be the principal noise component at low frequencies of operation, it is highly desirable that circuits operating within such frequencies be constructed in such a manner as to decrease 1/f noise to an acceptably low level.

U.S. Pat. No. 4,633,086, to Parrish, Input Circuit For Infrared Detector, assigned to the common assignee, describes one technique for biasing the on-focal-plane processing circuit to maintain the associated detector in a zero bias condition, thus reducing 1/f noise and enhancing the signal to noise ratio of the circuit.

Reduction of 1/f noise in the preamplifier, where the preamplifier transistor is a field effect device, is conventionally obtained by increasing the area of the channel region under the gate. This large area over the semiconductor substrate surface results in a decrease in circuit component density or decreased circuit component miniaturization. In the present invention, the channel region of a junction field effect transistor (JFET) is formed in a trench in the semiconductor. The transistor then occupies far less semiconductor substrate surface and so enables a high component density circuit to be obtained.

In co-pending applications, applicant has disclosed constructions of a trench gate MOS field effect transistor (MOSFET) alone and integrated with a capacitor in a single trench. Such constructions provide large area trench gate regions to obtain low 1/f noise without consuming large amounts of semiconductor surface area. The present invention expands on the disclosure of applicants co-pending applications by modifying the transistor construction to provide additional radiation hardness to the circuit. Conventional construction of a MOSFET utilizes a layer of silicon dioxide separating the gate electrode from the channel semiconductor region. When such a transistor it is irradiated by gamma rays; one result is to establish a residual charge in the silicon dioxide, which provides a constant bias on the transistor channels. This bias typically impedes the operation of the transistor by, for example, keeping the transistor in an on state, or by varying its threshold.

Radiation hardness is provided by a different transistor construction wherein an insulating layer in the gate region is eliminated. The junction field effect transistor (JFET) is characterized by a construction wherein the insulating layer is replaced by a p-n junction which does not accumulate a bias charge on irradiation. Consequently, the JFET construction avoids the need to use materials that would result in storing a residual charge upon irradiation. It further extensively utilizes silicon nitride as a dielectric and insulator in place of silicon dioxide. Since silicon nitride does not accumulate charge from ionizing radiation, it avoids spurious residual charge effects that can otherwise appear at silicon dioxide, silicon interfaces.

SUMMARY OF THE INVENTION

A method and construction are disclosed to form a trench gate JFET transistor. The invention comprises forming a first trench in a semiconductor substrate, forming a gate channel in the trench and forming a conductive layer upon the surface of the gate channel. Source and drain regions are formed adjacent to a trench and disposed in electrical contact with the gate channel. An integral capacitor may be added to the construction by forming a second trench, which extends through and excavates a portion of the first trench. The drain region is extended about the surface of the second trench to remain in electrical contact with the gate channel. A layer of insulating material is applied to the second trench, which is then filled with a body of conductive material. The conductive material is insulated from the conductive layer by the insulating layer.

The present invention may be embodied in the construction of the trench gate JFET transistor alone, or with the construction of an integral capacitor. In either case the construction may be supplemented by the formation of a complementary trench gate JFET in an additional region of doped material isolating the source region, drain region and gate channel from the substrate.

In another embodiment the present invention includes a complementary trench gate JFET that can be connected to the integral JFET-capacitor device to form a circuit wherein a complementary JFET preamplifier is connected in series with a storage capacitor.

In the presently preferred embodiment the substrate is formed of p-type silicon, the gate channel is formed of n-type material formed within the trench by shallow diffusion and a conductive layer is formed of p-type material grown on the gate channel. For the complementary JFET a region of doped material isolating the substrate from the source, drain and gate regions is formed of n+type material in the preferred embodiment.

Where an integral capacitor is not desired, it may not be necessary to fill te transistor trench. However, if desired, the trench may be filled with a body of insulating material, such as silicon dioxide.

DETAILED DESCRIPTION OF THE PRESENTLY PREFERRED EMBODIMENT

Figure 1:
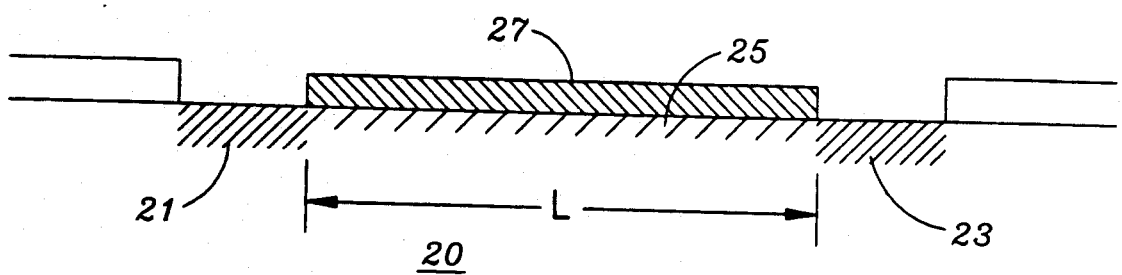
FIG. 1 is a cross sectional view of a contemporary JFET structure.

The detailed description set forth below in connection with the appended drawings is intended as a description of the presently preferred embodiment of the invention, and is not intended to represent the only form in which the present invention may be constructed or utilized. The description sets forth the functions and sequence of steps for construction of the invention in connection with the illustrated embodiment. It is to be understood, however, that the same or equivalent functions and sequences may be accomplished by different embodiments that are also intended to be encompassed within the spirit and scope of the invention. Furthermore, a similar trench gate embodiment can be used to form complementary MOS field effect transistors as well as the junction field effect transistors described here.

As previously noted large numbers of closely spaced, high component density integrated circuit processor channels may be used in on-focal-plane signal processors. Each detector element in the detector array may be connected to a preamplifier, such as a CMOS preamplifier, in an analog processor circuit. Low preamplifier noise is essential to prevent degradation of detector sensitivity. Since the preamplifiers are operated at low frequency, a principal source of noise if flicker or 1/f noise. The 1/f noise is inversely proportional to the area of the channel or gate regions of an MOS transistor, as expressed in the following equation:*:

$$v^2 = \frac{K\Delta f}{C_{ox}WLf},$$

where
v = the characteristic noise in microvolts;
K = a constant;
$\Delta f$ = bandwidth
f = the frequency of operation;
$C_{ox}$ = characteristic capacitance of the oxide layer;
W = the width of the gate; and
L = the length of the gate.
*See: R. Gregorian and G.C. Temes, Analog MOS Integrated Circuits In Signal Processing, John Wiley & Sons, N.Y., N.Y. (1986).

A large area gate region in a MOS transistor will produce a low 1/f noise component. However, such a structure requires a large amount of semiconductor surface area. This makes it difficult to obtain a high density of such integrated circuit functions. The present invention is directed to a structure and process for enhancing the area of the gate region without enhancing the semiconductor surface area.

The MOS transistor gate region may be regarded as a capacitor, which is formed by a metal oxide semiconductor cross section. Large area capacitors that preserve semiconductor surface are obtained in bulk silicon by using the walls of trenches, grooves or holes, which are cut in silicon, for example, by plasma or reactive ion etching. In such a manner, gate region area may be enhanced by using the depth of the trench to enlarge the electrode channel area without the need to use a large amount of the semiconductor surface. The present invention recognizes the capacitive characteristics of the MOS transistor gate region and applies particular trench forming techniques to the construction of the MOS transistor. In such a manner the MOS transistor gate channel area or gate channel region, is enhanced, mitigating 1/f noise, without the need to use large amounts of the semiconductor surface.

FIG. 1 illustrates a junction field effect transistor (JFET) constructed in accordance with conventional techniques. As shown therein n-JFET 11 is formed of an n-dope source region 21 and an n-doped drain region 23 formed in p-doped silicon 20. The channel between source and drain is the shallow n-type region 25. The gate junction is formed by the p-type layer 27 over region 35.

In relation to FIG. 1 the characteristic 1/f noise is related to the width and length of the gate area intermediate to the source and drain. The length of the gate area, labeled L, is shown at FIG. 1. The width of te gate area is orthogonal to the plane of the drawing. By increasing the length of the gate L, 1/f noise is reduced, though the maximum speed at which the circuit will efficiently operate is reduced. The present invention is directed to a construction and technique wherein the gate area is enhanced without the need to appropriate greater surface area of the semiconductor wafer.

Figure 2:
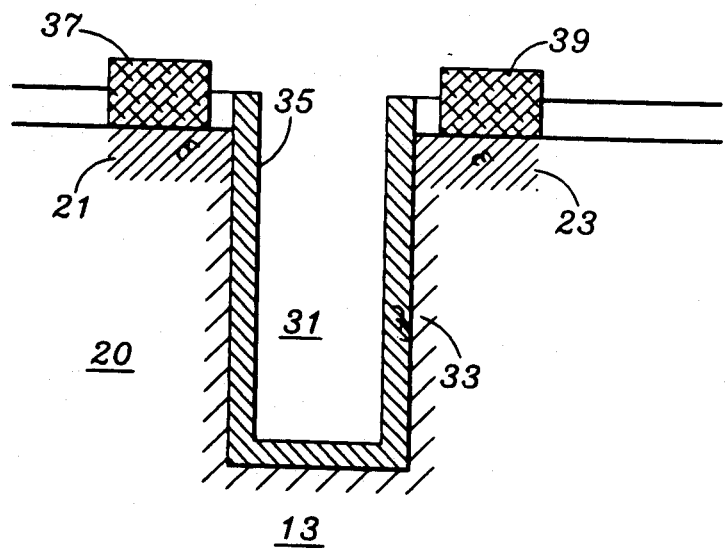
FIG. 2 is a cross sectional view of a trench gate JFET in accordance with the present invention.
Figure 3:
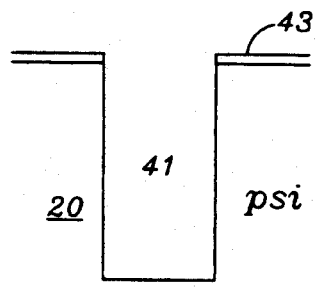
FIGS. 3-10 are cross sectional views illustrating the construction of an integrated trench JFET-capacitor circuit element in accordance with the present invention.

FIG. 2 illustrates one embodiment of the present invention. As with the JFET 11 shown at FIG. 1, JFET 13 comprises an n-doped source region 21, and an n-doped drain region 23, both formed in p-doped silicon 20. Unlike the construction shown at FIG. 1, a trench 31 is formed in the silicon substrate. The trench may be formed by any of a variety of techniques, such as reactive ion etching. A shallow n-type layer 33 is formed by dopant diffusion in the vertical and bottom silicon surfaces of trench 31. The gate junction can be formed by growing a p-type epitaxial layer of silicon 35 over layer 33. It may be necessary to apply a supporting conductive layer, such as metal or degenerately doped polycrystalline silicon, over layer 35 to provide sufficiently high gate electrode conductivity. In an alternative structure the trench can be filled with an insulator material such as silicon nitride or silicon dioxide or with a conductive material without the need for a supporting conductive film. Electrodes 37, 39 may be formed on the upper exposed surfaces of source 21 and drain 23, respectively. An additional electrode (not shown) may be formed to facilitate contact with the layer 35.

In accordance with the construction shown at FIG. 2 the gate region intermediate to the source 21 and drain 23 is enlarged by means of a formation of trench 31. In the presently preferred embodiment trench 31 is formed to be up to approximately 10 to 20 microns deep and 2 to 3 microns wide. The width of the trench (orthogonal to the plane of FIG. 2) is in the range of 10 to 20 microns. Te particular dimensions may be selected in accordance with the desired noise characteristics and speed of the transistor, and the available surface area.

Figure 17:
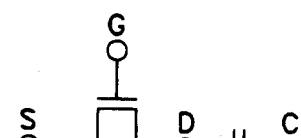
FIG. 17 is a schematic representation of a trench JFET-capacitor integrated circuit element in accordance with the present invention.

The construction illustrated at FIG. 2 provides the advantages of low 1/f noise without the penalty in terms of semiconductor surface area. Unlike a MOSFET with a silicon dioxide gate insulator layer, there is virtually no residual bias charge accumulation in the p-n junction gate of the JFET caused by irradiation by a source of gamma rays. In addition, the present invention provides for integration of a capacitor in series with the transistor drain, as schematically represented at FIG. 17.

Two construction sequences are illustrated and described below. The first, illustrated at FIGS. 3-10 results in the construction of a trench gate n-JFET integrated circuit element, which may optionally incorporate a series capacitor. The second technique, illustrated at FIGS. 11-16, results in the construction of a complimentary p-JFET integrated circuit.

The construction of the n-JFET, and integrated series capacitor, proceeds as follows. First, a trench 31 is formed in the silicon dioxide or nitride 43 coated substrate 20. Contemporary techniques such as reactive ion etching may be used to form the trench. The depth of the trench may vary in accordance with the desired operating characteristics of the circuit. It is presently anticipated that the trench 31 could extend up to approximately 20 microns. The substrate may be p-type bulk silicon.

Figure 4:
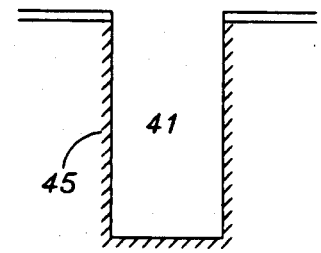

As illustrated in FIG. 4 an n-type channel region 45 is then formed at the surface of trench 41. The region 45 maybe formed by shallow diffusion. The n-type region 45 forms a transistor channel as described more fully below.

Figure 5:
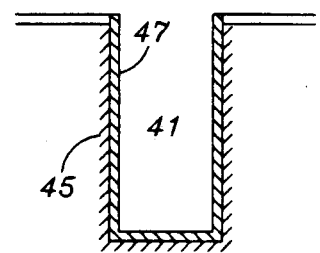

As shown in FIG. 5 a p-type expitaxial layer 47 is then grown on the n-type region 45 to form the gate junction characteristic of JFET. The p-type layer 47 is preferably doped to assure operation at low temperature. It is anticipated that in some applications it may be desirable to form an additional conductive layer, such as a metal film, above p-type layer 47 to insure sufficient gate electrode conductivity in such low temperature applications.

Figure 6:
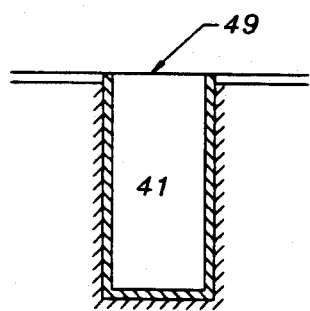

As shown at FIG. 6, trench 41 is then substantially filled with a body of insulating material 49, such as silicon dioxide. It should be noted that the use of silicon dioxide as such insulating material to form body 49 will not result in the undesirable residual gate bias conditions described above.

Figure 7:
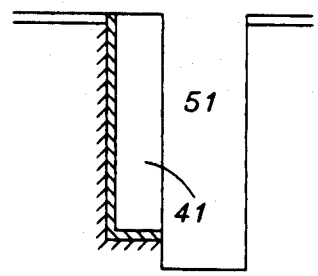

Beginning with FIG. 7 a construction is illustrated wherein a capacitor is integrated into the construction of the trench gate JFET. It is to be understood, however, that the present invention finds application without the construction of an integral series capacitor. In the embodiments illustrated the construction steps are sequenced for the most convenient formation of an integral JFET-capacitor circuit. However, as will be recognized by those of ordinary skill in the art, certain of the steps may be excluded or modified in sequence in the event that an integral capacitor circuit is not desired.

As shown in FIG. 7 a second trench 51 is then formed in the substrate 20. In the illustrated embodiment the second trench 51 extends through and excavates a portion of trench 41. However, the depth of both trenches may be varied in accordance with the desired characteristics of the JFET and the series capacitor. The trench 51 provides space for the formation of a film capacitor disposed in series with the JFET.

Figure 8:
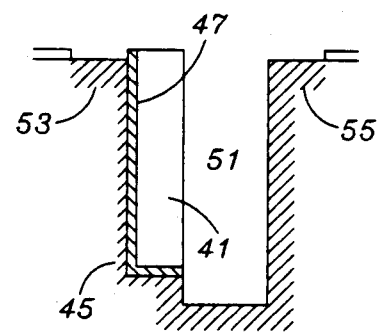

As shown in FIG. 8 the construction further proceeds by the removal of segments of the insulating layer 43 and the formation of drain and source regions 53, 55, respectively. Source region 53 and drain region 55 are preferrably formed by diffusion to form n+type regions. The regions 53 and 55 extend to layer 47. The n+type regions 53 and 55 are heavily doped in relation to n-type region 45. The channel region 45 is constructed to be thin and less heavily doped than the source and drain regions 53 and 55 to enable charge carriers to be depleted and so to reduce current flow in the channel when a small signal is applied to gate layer 47.

Figure 9:
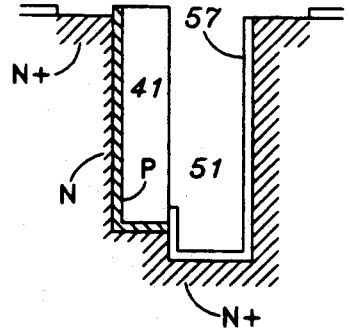

FIG. 9 illustrates the formation of the capacitor dielectric 57. The dielectric 57 may be formed by thermal oxidation of the exposed surface trench 51. The oxidation of the surface of trench 51 produces an insulating layer of silicon dioxide, which comprises the dielectric 57. The dielectric 57 can also be made by vapor depositing a film of either silicon dioxide or silicon nitride. Chemical vapor deposition, of either materials is well practiced process.

Figure 10:
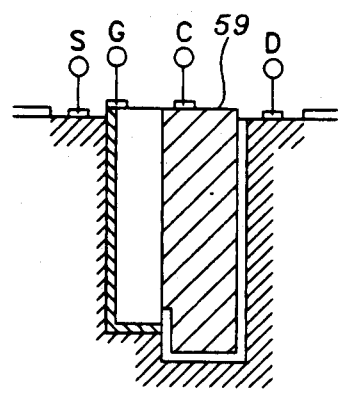

FIG. 10 illustrates the formation of the capacitor electrode 59. The electrode 59 may be formed by filling the trench 51 with a body of conductive material, such as metal or degenerately doped polycrystalline silicon. Metal film contact pad and lead may be formed on the surface of the wafer (not shown) to facilitate communication of signals to and from the circuit. FIG. 17 schematically illustrated the physical circuit depicted at FIG. 10, and includes corresponding source, gate drain and capacitor output terminals.

FIGS. 11-16 illustrate the fabrication of a complementary trench p-JFET transistor in a p-type silicon wafer. The construction technique differs from that described in connection with FIGS. 3-10 in that the source and drain regions are p-type material and a gate n-p junction, as opposed to the previously described p-n junction, is isolated from the p-type silicon substrate by an n+ type region diffused into the substrate. Additionally, the construction illustrated at FIGS. 11-16 does not incorporate in integral series capacitor. However, it is to be understood that the construction of the complementary p-JFET transistor may be supplemented to incorporate an integral capacitor in accordance with the same construction steps illustrated in connection with FIGS. 7-10.

Figure 11:
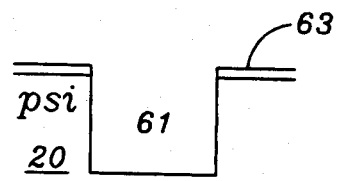
FIGS. 11-16 are cross sectional views illustrating the construction of a complementary trench JFET integrated circuit element in accordance with the present invention.
Figure 12:
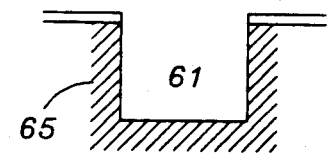

Referring to FIG. 11 a trench 61 is formed in insulator coated substrate 20. The substrate 20 in this embodiment is a p-type bulk silicon substrate. The trench 20 may be formed, for example, by reactive ion etching of the substrate. An insulating layer 63 is formed on the upper surface of the substrate. The insulating layer may commonly be silicon dioxide or silicon nitride. As shown in FIG. 12 a deep n+ region is then formed, by diffusion, within the substrate 20 about trench 61. The n+ region 65 serves to isolate the n-p gate junction, as well as the source and drain regions from the bulk silicon.

Figure 13:
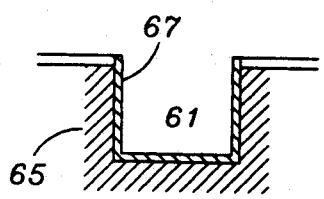
Figure 14:
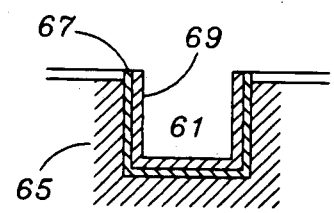

FIGS. 13 and 14 illustrate the construction of the gate n-p junction. First, a thin, lightly doped p-type epitaxial layer 67 is grown in the trench to form the gate channel. An n-type epitaxial layer 69 is then grown on the p-type layer 67 to form the gate junction. It should be understood that it may also be necessary to form an additional conductive layer, such as a metal film, upon n-type layer 69.

Figure 15:
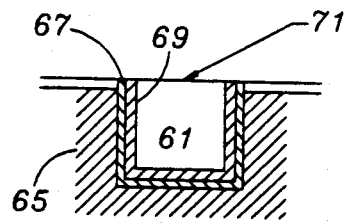

FIG. 15 illustrates filling trench 61 with a body of material 71. In the presently preferred embodiment the body of material 71 is either silicon dioxide or silicon nitride which has been vapor deposited within trench 61. Should an integral series capacitor be added to the circuit, as illustrated in connection with FIGS. 7-10, an additional trench may be formed in the substrate. However, both the n-JFET illustrated at FIG. 6 and the p-JFET illustrated at FIG. 16 have application independent of the inclusion of a series capacitor.

Figure 16:
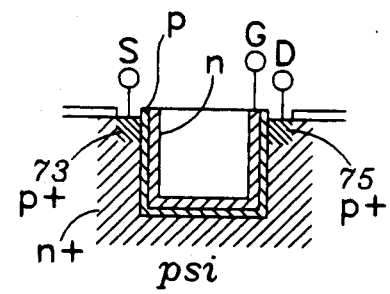

Because the construction illustrated FIGS. 15 and 16 does not include an integral series capacitor, it should be understood that the body of material 71 may be conductive material instead of insulating material. Similarly, the body of material 49 (FIG. 6) may also be a conductive material where the capacitor is not formed integral with the n-JFET.

FIG. 16 illustrates the formation of source region 73 and drain region 75. In practice, the source and drain regions are formed by removing a portion of the insulating layer 63 and diffusing p+ type material into the substrate 20 within the n+ region 65. The source and drain regions are isolated from the substrate 20 by the n+ region 65. Consequently, the diffusion of n+ region 65 must be sufficiently deep to facilitate such isolation.

FIG. 16 illustrate the types of materials applied to form the p-JFET, as well as the location of source, gate and drain terminals. It is to be understood that the gate terminal may be relocated anywhere along layer 69, or upon the surface of body 71, where body 71 is formed of conductive material.

Figure 18:
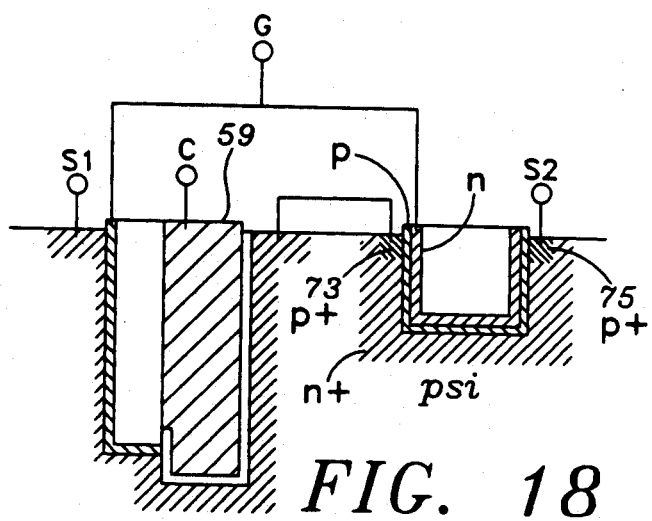
FIG. 18 is a cross sectional view of an integral JFET-capacitor circuit element and a complementary JFET where the transistor drains are connected in series with the capacitor.

FIG. 18 illustrates the connection of the integral n-JFET-capacitor and the p-JFET to form a circuit where the output of a complementary JFET circuit element is stored in the capacitor. It should be noted that the gate region of the n-JFET and the p-JFET may be sized to be substantially the same area.

As described above it is to be understood that various modifications in the construction and fabrication processes described above may be implemented without departing from the broader aspects of the invention.

What is claimed is:

1. A method of forming a trench gate JFET comprising:
    forming a first trench in a semiconductor substrate of a first conductivity type;
    forming a region of a semiconductor material of a second conductivity type within the substrate adjacent to the first trench;
    forming a layer of semiconductor material of a first conductivity type within the first trench upon the surface of said semiconductor material of the second conductivity type, said layer of semiconductor material of the first conductivity type interfacing with said region of semiconductor material of the second conductivity type to form a p-n junction; and
    forming source and drain regions within said substrate adjacent to said first trench, said gate and source regions being in contact with said region of semiconductor material of a second conductivity type.

2. The process as recited in claim 1 wherein said substrate is formed of p-type silicon.

3. The process as recited in claim 1 wherein said region of semiconductor material of a second conductivity type is formed of n-type material formed within the first trench by shallow diffusion.

4. The process as recited in claim 1 further comprising forming a body of material within the first trench upon said conductive layer.

5. The process as recited in claim 4 wherein said body of material is formed of insulating material.

6. The process as recited in claim 1 further comprising the steps of:
    forming a second trench within the substrate, said second trench extending through and excavating a portion of said first trench;
    forming a layer of insulating material within said second trench;

filling said second trench with a body of conductive material, said body of conductive material being insulated from said layer of semiconductor material of the first type by said insulating layer;

said source and drain regions being formed within said substrate adjacent to said first and second trenches respectively;

wherein an output taken from the body of conductive material is representative of a capacitor in series with the drain region.

7. The process as recited in claim 6 wherein said step of forming said source and drain regions comprises forming a drain region within said substrate adjacent to said second trench.

8. A method of forming a trench gate JFET comprising:

providing a substrate of a semiconductor material of a first conductivity type;

forming a region of semiconductor material of a second conductivity type within said substrate;

forming a first trench in said substrate, such that said trench is within said region of semiconductor material of a second conductivity type;

forming a region of semiconductor material of a first conductivity type within said substrate adjacent to the first trench;

forming a layer of semiconductor material of a second conductivity type with the first trench upon the surface of said semiconductor material of the first conductivity type, said layer of semiconductor material of the second conductivity type interfacing with said region of semiconductor material of a first conductivity type to form a p-n junction; and forming source and drain regions within said substrate adjacent to said first trench, said gate and source regions being in contact with said region of semiconductor material of the first conductivity type.

9. The process as recited in claim 8 wherein said region of semiconductor material of a second conductivity type formed within said substrate is formed of n-type material.

10. The process as recited in claim 9 further comprising the steps of:

forming a second trench within the substrate, said second trench extending through and excavating a portion of said first trench;

forming a layer of insulating material within said second trench;

filling said second trench with a body of conductive material, said body of conductive material being insulated from said layer of semiconductor material of the second conductivity type by said insulating layer;

said source and drain regions being formed within said substrate adjacent to said first and second trenches respectively;

wherein an output taken from the body of conductive material is representative of a capacitor in series with the drain region.

11. The process as recited in claim 10 wherein said step of forming said source and drain regions comprises forming a drain region within said substrate adjacent to said second trench.

12. A process of forming an integral trench gate JFET transistor-capacitor comprising;

forming a first trench in a semiconductor substrate;

forming a gate and channel regions within the substrate adjacent to the first trench;

forming a conductive layer within the first trench upon said gate channel;

forming a second trench within the substrate, said second trench extending through and excavating a portion of said first trench;

forming source and drain regions within said substrate adjacent to said first and second trenches respectively, said source and drain regions being in contact with said gate and channel regions;

forming a layer of insulating material within said second trench; and filling said second trench with a body of conductive material, said body of conductive material being insulated from said conductive layer by said insulating layer;

wherein said capacitor is connected in series with the drain region.

13. The process as recited in claim 12 wherein said step of forming said source and drain regions comprises forming a drain region within said substrate adjacent to said second trench.

14. A method of forming a complementary JFET circuit including an integral and JFET-capacitor and a p-JFET, the method comprising:

forming a first trench in a semi-conductor substrate;

forming first gate and channel regions within the substrate adjacent to the first trench;

forming a first conductive layer within the first trench upon said first gate region;

forming a second trench within the substrate, said second trench extending through and excavating a portion of said first trench;

forming first source and drain regions within said substrate adjacent to said first and second trenches respectively, said first source and drain regions being in contact with said first gate and channel regions;

forming a first layer of insulating material within said second trench;

filling said second trench with a first body of conductive material, said first body of conductive material being insulated from said conducitve layer by said insulating layer;

wherein said capacitor is connected in series with the first drain region;

forming a third trench in the semi-conductor substrate;

forming a second gate channel within said third trench;

forming a second conductive layer within said third trench upon the surface of said second gate channel, said second conductive layer interfacing with said second gate channel region to form a p-n junction;

forming second source and drain regions, within said substrate adjacent to said third trench, said second gate and source regions being in contact with said second channel region;

connecting said first and second drain regions; and
connecting said first and second gate regions.

* * * * *

UNITED STATES PATENT AND TRADEMARK OFFICE
CERTIFICATE OF CORRECTION

PATENT NO. : 5,010,025
DATED : April 23, 1991
INVENTOR(S) : Allen L. Solomon

It is certified that error appears in the above-identified patent and that said Letters Patent is hereby corrected as shown below:

In column 2, line 16, after "noise," insert --in particular, from the preasmplifier. Such noise--.

In column 3, line 49, delete "te" and insert therefore --the--.

In column 4, line 37, delete "$v^2$" and insert therefore --$\bar{v}^2$--.

In column 5, line 18, delete "te" and insert therefore --the--.

In column 5, line 56, delete "Te" and insert therefore --The--.

Signed and Sealed this

Twentieth Day of October, 1992

*Attest:*

DOUGLAS B. COMER

*Attesting Officer*  *Acting Commissioner of Patents and Trademarks*